(12) United States Patent
Shibata et al.

(10) Patent No.: US 8,219,743 B2
(45) Date of Patent: Jul. 10, 2012

(54) SEMICONDUCTOR DEVICE WITH DOUBLE PROGRAM PROHIBITION CONTROL

(75) Inventors: Kenji Shibata, Kani (JP); Masahiko Okura, Nagoya (JP); Mitsuhiro Nagao, Tajimi (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/052,486

(22) Filed: Mar. 21, 2011

(65) Prior Publication Data

US 2011/0173379 A1 Jul. 14, 2011

Related U.S. Application Data

(63) Continuation of application No. 12/012,390, filed on Feb. 1, 2008, now Pat. No. 7,934,051.

(30) Foreign Application Priority Data

Feb. 1, 2007 (JP) .................................. 2007-023570

(51) Int. Cl.
*G06F 12/00* (2006.01)
(52) U.S. Cl. ................................. 711/103; 711/E12.091
(58) Field of Classification Search .................... None
See application file for complete search history.

(56) References Cited

U.S. PATENT DOCUMENTS

| | | | |
|---|---|---|---|
| 5,355,336 A | 10/1994 | Yoshioka | |
| 5,991,197 A | 11/1999 | Ogura et al. | |
| 6,108,235 A | 8/2000 | Honma | |
| 6,198,657 B1 * | 3/2001 | Uekubo et al. | 365/185.04 |
| 6,215,717 B1 | 4/2001 | Takeguchi et al. | |
| 6,229,731 B1 | 5/2001 | Kasai et al. | |
| 6,266,271 B1 | 7/2001 | Kawamura | |
| 6,597,602 B2 | 7/2003 | Imamiya et al. | |
| 6,600,676 B2 | 7/2003 | Shibata et al. | |
| 6,970,381 B2 | 11/2005 | Nakata | |
| 2002/0002654 A1 | 1/2002 | Tomohiro | |
| 2002/0178338 A1 | 11/2002 | Shibuya et al. | |
| 2007/0033333 A1 * | 2/2007 | Kato et al. | 711/103 |
| 2009/0049253 A1 * | 2/2009 | Shibata et al. | 711/154 |

FOREIGN PATENT DOCUMENTS

| | | |
|---|---|---|
| JP | 11232884 | 8/1999 |
| JP | 11306086 | 11/1999 |
| JP | 2002366436 | 12/2002 |
| JP | 2005085398 | 3/2005 |

* cited by examiner

*Primary Examiner* — Edward Dudek, Jr.
*Assistant Examiner* — John P Fishburn

(57) ABSTRACT

The present invention provides a semiconductor device and a method for controlling the semiconductor device, the semiconductor device including memory regions; program prohibition information units storing program prohibition information to be used for determining whether to prohibit or allow programming in the memory regions corresponding to the program prohibition information units; a first prohibition information control circuit that prohibits a change of the program prohibition information from a program prohibiting state with respect to a memory region based on first prohibition information; and a second prohibition information control circuit that prohibits a change of the program prohibition information from a program allowing state to a program prohibiting state with respect to the corresponding memory region based on second prohibition information with respect to the corresponding memory region.

15 Claims, 16 Drawing Sheets

FIG. 6

| FIRST PROHIBITION INFORMATION (CAM1 DATA) 0 : STB 1 : not STB | 1 | | 0 | |
|---|---|---|---|---|
| SECOND PROHIBITION INFORMATION (CAM6 DATA) 0 : WPCAM WRITE PROHIBITED 1 : WPCAM WRITE ALLOWED | 0 | 1 | 0 | 1 |
| WPCAM ERASE SWITCH 25 | ON | ON | OFF | OFF |
| WPCAM WRITE SWITCH 27 | OFF | ON | OFF | ON |

FIG. 9

| FIRST PROHIBITION INFORMATION (CAM1 DATA) 0:STB 1:not STB | 1 | | 0 | |
|---|---|---|---|---|
| SECOND PROHIBITION INFORMATION (CAM6 DATA) 0: WPCAM WRITE PROHIBITED 1: WPCAM WRITE ALLOWED | 0 | 1 | 0 | 1 |
| WPCAM ERASE SWITCH 25 | OFF | ON | OFF | OFF |
| WPCAM WRITE SWITCH 27 | OFF | ON | OFF | ON |

FIG. 13

| FIRST PROHIBITION INFORMATION (CAM1 DATA)<br>0: STB<br>1: not STB | 1 | 0 | | 1 | 0 |
|---|---|---|---|---|---|
| SECOND PROHIBITION INFORMATION (CAM6 DATA)<br>0: WPCAM WRITE PROHIBITED<br>1: WPCAM WRITE ALLOWED | 1 | | | 0 | |
| AUXILIARY PROHIBITION INFORMATION (CAM3 DATA)<br>0: AUXILIARY INFORMATION NULLIFIED<br>1: AUXILIARY INFORMATION VALID | NOT DEPENDED | 0 | 1 | NOT DEPENDED | |
| AUXILIARY PROGRAM PROHIBITION INFORMATION (RESET PIN DATA)<br>0: PROGRAM PROHIBITED<br>1: PROGRAM ALLOWED | 0 | 1 | 0 | 1 | NOT DEPENDED | NOT DEPENDED |
| WPCAM ERASE SWITCH 25 | ON | ON | OFF | OFF | OFF | ON | OFF |
| WPCAM WRITE SWITCH 27 | OFF | ON | OFF | ON | ON | OFF | OFF |

FIG. 16

| | | | | | | | |
|---|---|---|---|---|---|---|---|
| FIRST PROHIBITION INFORMATION (CAM1 DATA)<br>0: STB<br>1: not STB | 1 | | 0 | | 1 | | 0 |
| SECOND PROHIBITION INFORMATION (CAM6 DATA)<br>0: WPCAM WRITE PROHIBITED<br>1: WPCAM WRITE ALLOWED | 1 | | | | 0 | | |
| AUXILIARY PROHIBITION INFORMATION (CAM3 DATA)<br>0: AUXILIARY INFORMATION NULLIFIED<br>1: AUXILIARY INFORMATION VALID | NOT DEPENDED | | 0 | | 1 | NOT DEPENDED | |
| AUXILIARY PROGRAM PROHIBITION INFORMATION (RESET PIN DATA)<br>0: PROGRAM PROHIBITED<br>1: PROGRAM ALLOWED | 0 | 1 | 0 | 1 | NOT DEPENDED | NOT DEPENDED | |
| WPCAM ERASE SWITCH 25 | ON | ON | OFF | OFF | OFF | OFF | OFF |
| WPCAM WRITE SWITCH 27 | OFF | ON | OFF | ON | ON | OFF | OFF |

SEMICONDUCTOR DEVICE WITH DOUBLE PROGRAM PROHIBITION CONTROL

CLAIM OF PRIORITY

This applications is a continuing patent application of US Utility Patent Application, entitled "Program And Erase Disabling Control of WPCAM by Double Controls," filed Feb. 1, 2008, application Ser. No. 12/012,390, incorporated in its entirety herein, which claims priority from Japanese patent application 2007-023570 filed Feb. 1, 2007 which was not published in English.

TECHNICAL FIELD

This invention relates generally to semiconductor devices and methods for controlling the semiconductor devices, and more particularly, to a semiconductor device having nonvolatile memory cells and a method for controlling the semiconductor device.

BACKGROUND OF THE INVENTION

Recently, nonvolatile memories that are data rewritable semiconductor devices have become widely used in many electronic devices such as portable telephone devices and digital cameras. A flash memory that is a typical nonvolatile memory can write data in the memory cells in a nonvolatile fashion by storing charges in the charge storage layer of each memory cell. Also, by erasing the charges in the charge storage layers, the flash memory can erase the data. Some nonvolatile memories have a protecting function for prohibiting data writing and erasing in the memory cells or prohibiting data reading from the cells for purposes of security.

In this specification, data writing (data being "0," and the threshold voltage of the subject memory cell being increased) or data erasing (data being "1," and the threshold voltage of the subject memory cell being reduced) is referred to as "programming " Also, data programming in a memory cell (data being changed from "1" to "0," or data being changed from "0" to "1"), data writing in a memory cell (data being changed from "1" to "0"), data erasing in a memory cell (data being changed from "0" to "1"), and data reading from a memory cell (data "0" or "1" being output) are referred to as memory cell programming, memory cell writing, memory cell erasing, and memory cell reading, respectively. Data programming, data writing, data erasing, and data reading in the memory cells in a memory region are referred to as memory region programming, memory region writing, memory region erasing, and memory region reading, respectively.

To prohibit programming (data writing or erasing) in memory cells, programming in each of the memory regions may be prohibited or allowed. This function is called the write protection function. To achieve this function, a program prohibition information unit that stores program prohibition information to be used for determining whether to prohibit or allow programming in each memory region is provided for each memory region in a nonvolatile memory.

Japanese Unexamined Patent Application No. 5-266681 discloses a nonvolatile memory that includes a write restricting resistor (equivalent to the program prohibition information unit) that restricts writing in the memory cell array, and a logic circuit that restricts writing in the write restricting resistor.

The technique disclosed in Japanese Unexamined Patent Application No. 5-266681 is applied to a nonvolatile memory that has the function of prohibiting a change of a memory region from a program prohibited state to a program allowed state after the memory region is put into a program prohibited state (in other words, once a program prohibited state is set, the subject memory region serves as a ROM). This function is called the STB (Set Top Box) function. In such a nonvolatile memory, the STB function can be selectively made valid or invalid. To achieve this function, there is ROM information (first prohibition information) to be used for determining whether to prohibit (the memory region is to be turned into a ROM) or allow (the memory region is not to be turned into a ROM) a change of the program prohibition information from a program prohibiting state to a program allowing state, after the program prohibition information is put into a program prohibiting state. The ROM information is stored in a ROM information nonvolatile memory. For example, when a nonvolatile memory is shipped, the ROM information is set in response to a request from the user. Alternatively, only an authorized user can set the ROM information. In this manner, data alteration by a hacker or the like in the ROM memory regions can be prevented.

Japanese Unexamined Patent Application No. 11-213680 discloses a nonvolatile memory that has a latch circuit for each write protected memory circuit (equivalent to each program prohibition information unit) so as to set two or more pieces of write protect information (equivalent to the program prohibition to information). In this nonvolatile memory, the program prohibition information for the write protected memory circuits can be simultaneously set through the latch circuits.

In a nonvolatile memory having the STB function, the usable memory area becomes smaller as many memory regions are put into a program prohibited state (or turned into ROMs). In other words, the working memory area becomes smaller. As a result, the system operation becomes more difficult. For example, if many memory regions are put into a program prohibited state by a hacker or the like, the working memory area becomes smaller, hindering the system operation.

SUMMARY OF THE INVENTION

The present invention has been made in view of the above circumstances and provides a semiconductor device and a method for controlling the semiconductor device, wherein a decrease in usable memory area when the STB function is hacked or the like can be prevented.

According to an aspect of the present invention, there is provided a semiconductor device including: memory regions that include nonvolatile memory cells; program prohibition information units that are provided for the respective memory regions, each of the program prohibition information units storing program prohibition information to be used for determining whether to prohibit or allow programming in a plurality of corresponding memory regions; a first prohibition information control circuit that prohibits a change of the program prohibition information from a program prohibiting state to a program allowing state with respect to the corresponding memory regions, based on first prohibition information to be used for determining whether to prohibit a change of the program prohibition information from a program prohibiting state to a program allowing state with respect to the corresponding memory region; and a second prohibition information control circuit that prohibits a change of the program prohibition information from a program allowing state to a program prohibiting state with respect to the corresponding memory region, based on second prohibition information to be used for determining whether to prohibit a change of the program prohibition information from a program allowing state to a program prohibiting state with respect to the corresponding memory region. In accordance with this aspect, the memory regions can be protected from hacking of the STB function or the like, and cannot be put into a program prohibited state.

According to another aspect of the present invention, there is provided a semiconductor device including: a plurality of memory regions that include nonvolatile memory cells; a plurality of program prohibition information units that are provided for the respective memory regions, each of the program prohibition information units storing program prohibition information to be used for determining whether to prohibit or allow programming in a corresponding memory region; and a first prohibition information control circuit that prohibits a change of the program prohibition information from a program prohibiting state to a program allowing state with respect to the corresponding memory regions, based on first prohibition information to be used for determining whether to prohibit a change of the program prohibition information from a program prohibiting state to a program allowing state with respect to the corresponding memory region; wherein, when the first prohibition information allows a change of the memory region from a program prohibited state to a program allowed state, the first prohibition information control circuit allows or does not allow a change of the program prohibition information from a program prohibiting state to a program allowing state with respect to the corresponding memory region, based on fourth prohibition information to be used for determining whether to allow a change of the program prohibition information from a program prohibiting state to a program allowing state with respect to the corresponding memory region, and wherein, when the first prohibition information prohibits a change of the memory region from a program prohibited state to a program allowed state, the first prohibition information control circuit prohibits a change of the program prohibition information from a program prohibiting state to a program allowing state with respect to the corresponding memory region, regardless of the fourth prohibition information. According to this aspect, the program prohibition information can be changed from the program allowing state to the program inhibiting state only when the two separate items of information allow a change from the program allowing state to the program prohibiting state. Thus, even if one of the items of information occurs is acquired by hacking, the program prohibition information cannot be changed, so that a high-security nonvolatile memory can be realized.

According to a further aspect of the present invention, there is provided a method for controlling a semiconductor device that includes a plurality of memory regions with nonvolatile memory cells, the method comprising: prohibiting a change of program prohibiting information from a program prohibiting state to a program allowing state with respect to a plurality of corresponding memory regions, based on first prohibiting information to be used for determining whether to prohibit a change of the program prohibiting information from a program prohibiting state to a program allowing state with respect to the corresponding memory region, the program prohibiting information used to determine whether to prohibit or allow programming in the corresponding memory regions; and prohibiting a change of the program prohibition information from a program allowing state to a program prohibiting state with respect to the corresponding memory region, based on second prohibition information to be used for determining whether to prohibit a change of the program prohibition information from a program allowing state to a program prohibiting state with respect to the corresponding memory region. In accordance with this invention, the memory regions can be protected from hacking of the STB function or the like, and cannot be put into a program prohibited state.

BRIEF DESCRIPTION OF THE DRAWINGS

FIG. 6 shows the actions taken where erasing and writing are performed in a WPCAM of the nonvolatile memory in accordance with the first embodiment;

FIG. 9 shows the actions taken where erasing and writing are performed in a WPCAM of the nonvolatile memory in accordance with the second embodiment;

FIG. 13 shows the actions taken where erasing and writing are performed in a WPCAM of the nonvolatile memory in accordance with the third embodiment;

FIG. 16 shows the actions taken where erasing and writing are performed in a WPCAM of the nonvolatile memory in accordance with the fourth embodiment.

DETAILED DESCRIPTION

The following is a description of embodiments of the present invention, with reference to the accompanying drawings.

Figure 1:
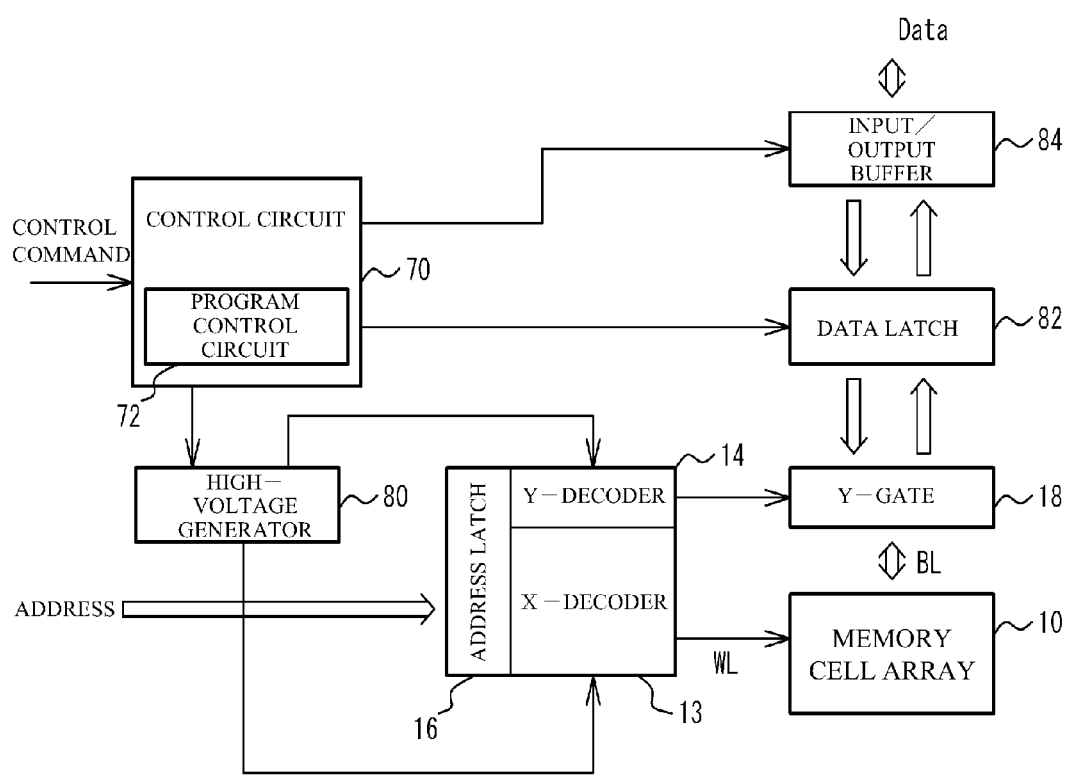
FIG. 1 is a block diagram of a nonvolatile memory in accordance with a first embodiment of the present invention.

FIG. 1 is a block diagram of a nonvolatile memory in accordance with a first embodiment of the present invention. In a memory cell array 10, nonvolatile memory cells that are connected to word lines WL and bit lines BL are arranged in a matrix fashion. In accordance with an address signal that is input from an external circuit to an address latch 16, an X-decoder 13 selects a word line WL, and a Y-decoder 14 selects a bit line BL via a Y-gate 18. Data that is input to or output from an input/output buffer 84 to or from an external circuit is latched by a data latch 82. The data is then programmed in or read out from the memory cell connected to the bit line BL selected by the Y-gate 18 and the word line WL selected by the X-decoder 13. In accordance with a control command that is input from an external circuit to a control circuit 70, a program control circuit 72 in the control circuit 70 controls the input/output buffer 84 and the data latch 82. The program control circuit 72 also controls a high-voltage generator 80. The high-voltage generator 80 supplies a high voltage for programming the data in or reading out the data from the memory cell via the Y-decoder 14 and the X-decoder 13.

Figure 2:
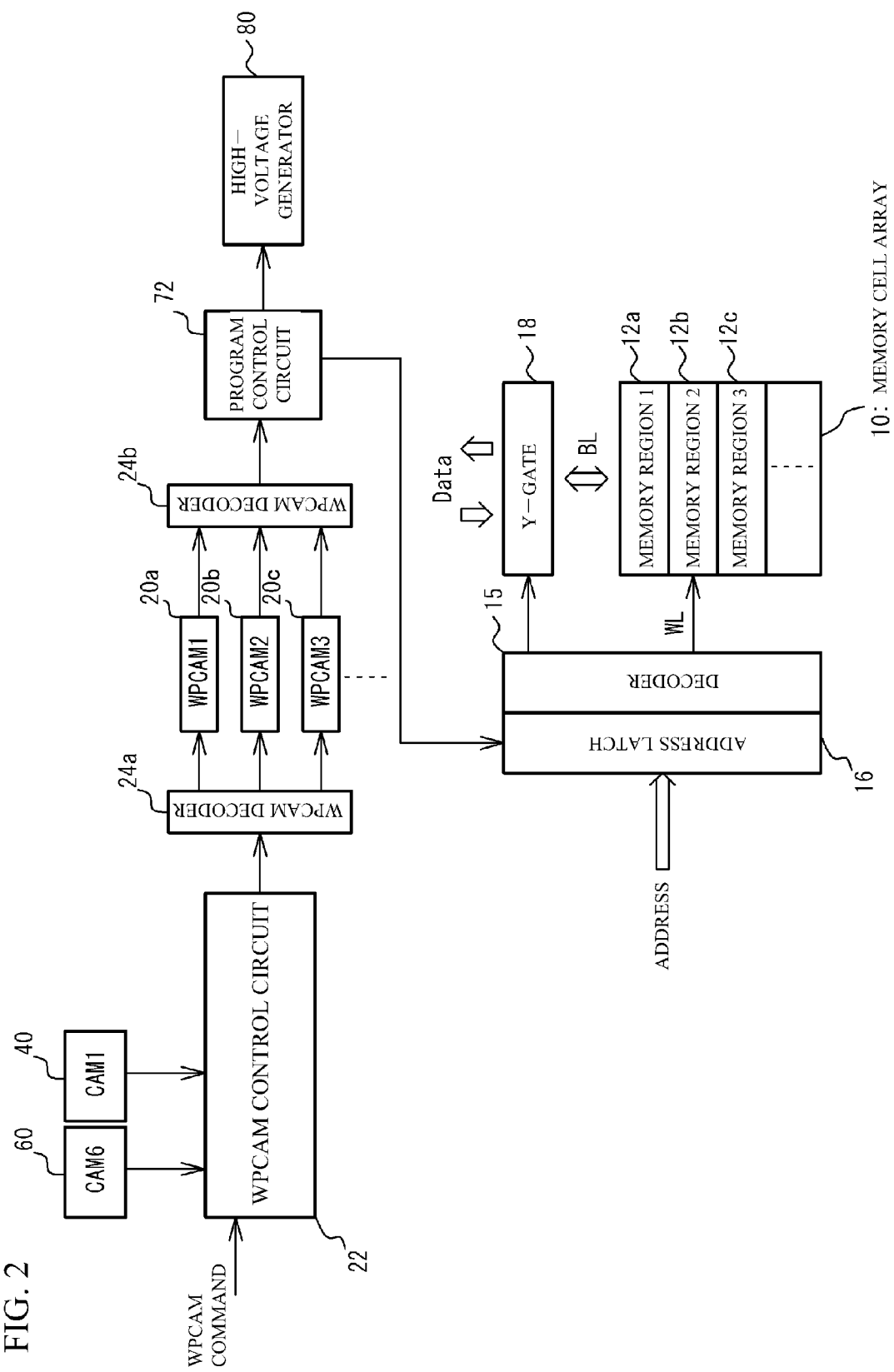
FIG. 2 is a block diagram showing the WPCAMs and the WPCAM-related components of the nonvolatile memory in accordance with the first embodiment.

FIG. 2 is a block diagram concerning WPCAMs (Write Protect Content Addressable Memories) that form the program prohibition information unit of the nonvolatile memory in accordance with the first embodiment. The memory cell array 10 has memory regions 12 (memory regions 12a, 12b, 12c, . . . ). The memory regions 12 have sectors including nonvolatile memory cells. A decoder 15 includes the X-decoder 13 and the Y-decoder 14 shown in FIG. 1. The WPCAMs 20 (20a, 20b, 20c, . . . ) are provided for the respective memory regions (12a, 12b, 12c, . . . ). The program prohibition information (WPCAM data) to be used for determining whether programming in the corresponding memory region 12 is prohibited or allowed is stored in each WPCAM 20.

WPCAM decoders 24a and 24b that decode the WPCAMs 20 are connected to the WPCAMs 20. A WPCAM command is input to a WPCAM control circuit 22, and a CAM1 (40) and a CAM6 (60) are connected to the WPCAM control circuit 22. In accordance with the WPCAM command and the data supplied from the CAM1 (40) and the CAM6 (60), the WPCAM control circuit 22 programs the WPCAMs 20 via the WPCAM decoder 24a.

The CAM1 (40) is the first nonvolatile prohibition information memory for a STB function. In a case where the WPCAM data (program prohibition information) indicates that programming is prohibited in the corresponding memory region 12, the first prohibition information memory stores first prohibition information (corresponding to the CAM1 data and ROM information) to be used for determining whether to allow a change of the WPCAM data from program prohibiting data to program allowing data in the corresponding memory region 12.

The CAM6 (60) is the second nonvolatile prohibition information memory that stores second prohibition information (corresponding to the CAM6 data) to be used for determining whether to prohibit a change of the WPCAM data (the program prohibition information) from program allowing data to program prohibiting data in the corresponding memory region 12.

When a memory region 12 is programmed, the WPCAM data (the program prohibition information) of the corresponding WPCAM 20 is read into the program control circuit 72 via the WPCAM decoder 24b. If the WPCAM data indicates that programming is prohibited in the corresponding memory region 12 (or the WPCAM data indicates the write state "0"), programming is not performed in the corresponding memory region 12. If the WPCAM data indicates that programming is allowed (or the WPCAM data indicates the erase state "1"), programming is performed in the corresponding memory region 12. Therefore, the program control circuit 72 controls the address latch 16 and the high-voltage generator 80.

Figure 3:
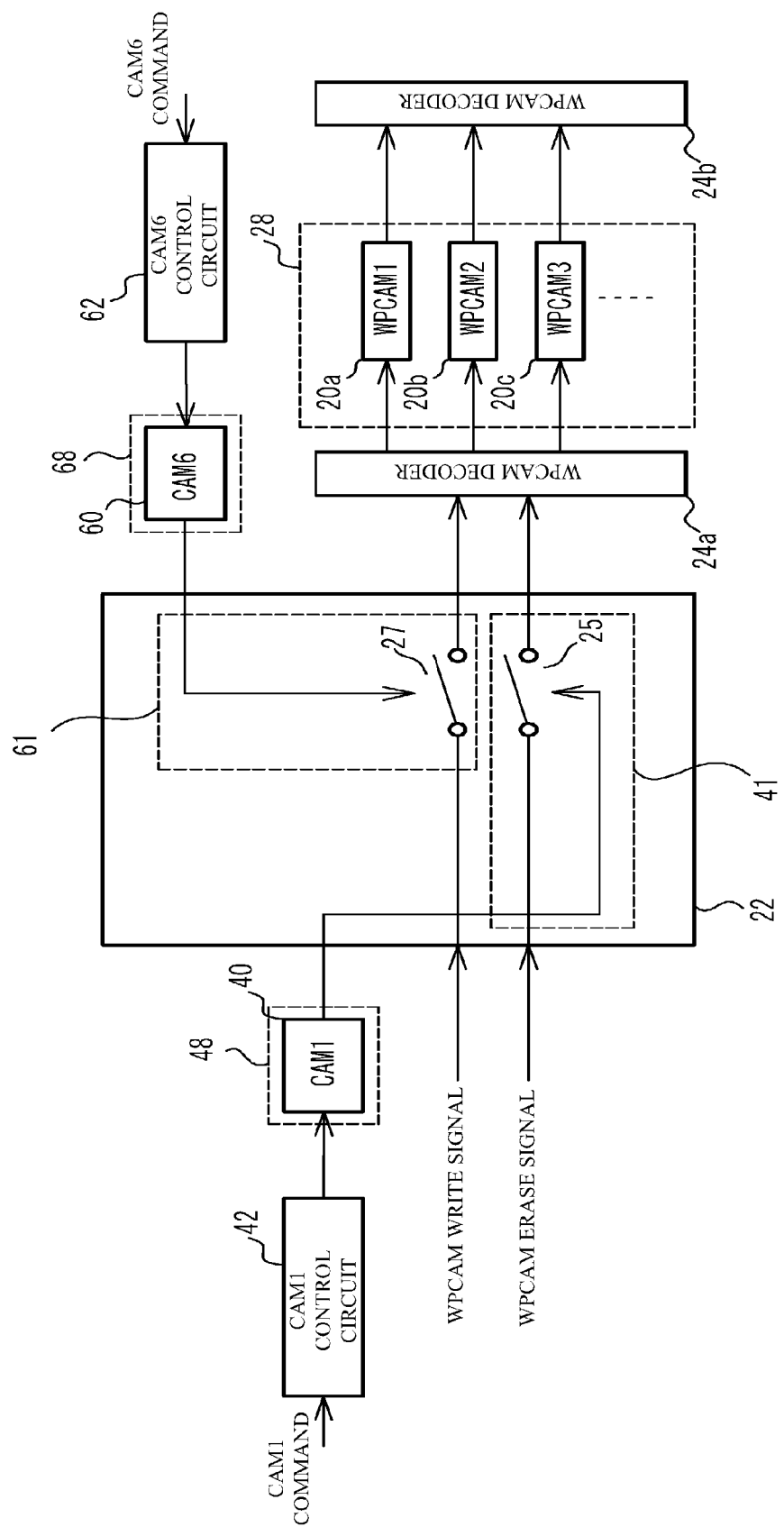
FIG. 3 is a block diagram showing the components surrounding the WPCAM control circuit of the nonvolatile memory in accordance with the first embodiment.

FIG. 3 is a block diagram showing the components surrounding the WPCAM control circuit 22. The same components as those shown in FIG. 2 are denoted by the same reference numerals as those in FIG. 2, and explanation of them is omitted here. The WPCAM control circuit 22 includes a first prohibition information control circuit 41 and a second prohibition information control circuit 61. The first prohibition information control circuit 41 has a switch 25, and the second prohibition information control circuit 61 has a switch 27. A WPCAM write signal and a WPCAM erase signal that are input to the WPCAM control circuit 22 are output to the WPCAM decoder 24a via the switches 27 and 25, respectively, and perform writing or erasing in the WPCAM 20 selected by the WPCAM decoder 24a. In accordance with a CAM1 command, a CAM1 control circuit 42 programs the CAM1 (40). In accordance with a CAM6 command, a CAM6 control circuit 62 programs the CAM6 (60). The CAM1 (40) and the CAM6 (60) are provided on p-type wells 48 and 68 of a semiconductor substrate. The p-type wells 48 and 68 may be provided independently of a p-type well 28 on which the WPCAMs 20 are provided. The effects of this arrangement will be described later. The CAM1 data (the first prohibition information) of the CAM1 (40) controls the switch 25. The CAM6 data (the second prohibition information) of the CAM6 (60) controls the switch 27.

Figure 4:
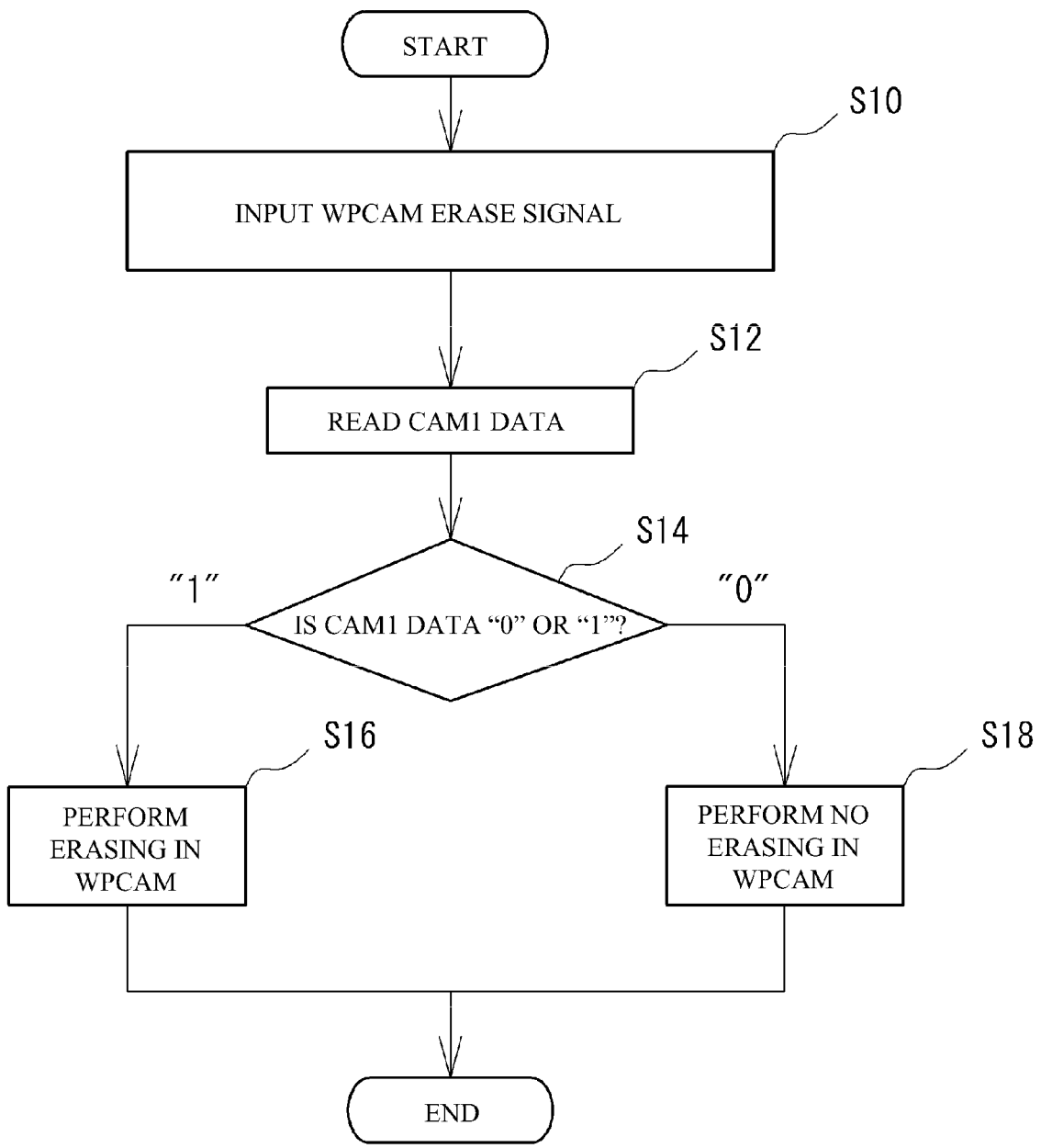
FIG. 4 is a flowchart of an operation to perform erasing in a WPCAM of the nonvolatile memory in accordance with the first embodiment.

FIG. 4 is a flowchart of an operation to be performed by the first prohibition information control circuit 41 in a case where erasing is performed in a WPCAM 20 (or in a case where the corresponding memory region is switched from a program prohibited state to a program allowed state). As shown in FIG. 4, a WPCAM erase signal is input to the first prohibition information control circuit 41 (step S10). The first prohibition information control circuit 41 reads the CAM1 data (the first prohibition information) from the CAM1 (40) (step S12). The first prohibition information control circuit 41 then determines whether the CAM1 data is "0" or "1" (step S14). If the CAM1 data is "1" (an erase state), the first prohibition information control circuit 41 turns the switch 25 on, to allow erasing in the WPCAM 20 (step S16). If the CAM1 data is "0" (a write state), the first prohibition information control circuit 41 turns the switch 25 off, to prohibit erasing in the WPCAM 20 (step S18).

Figure 5:
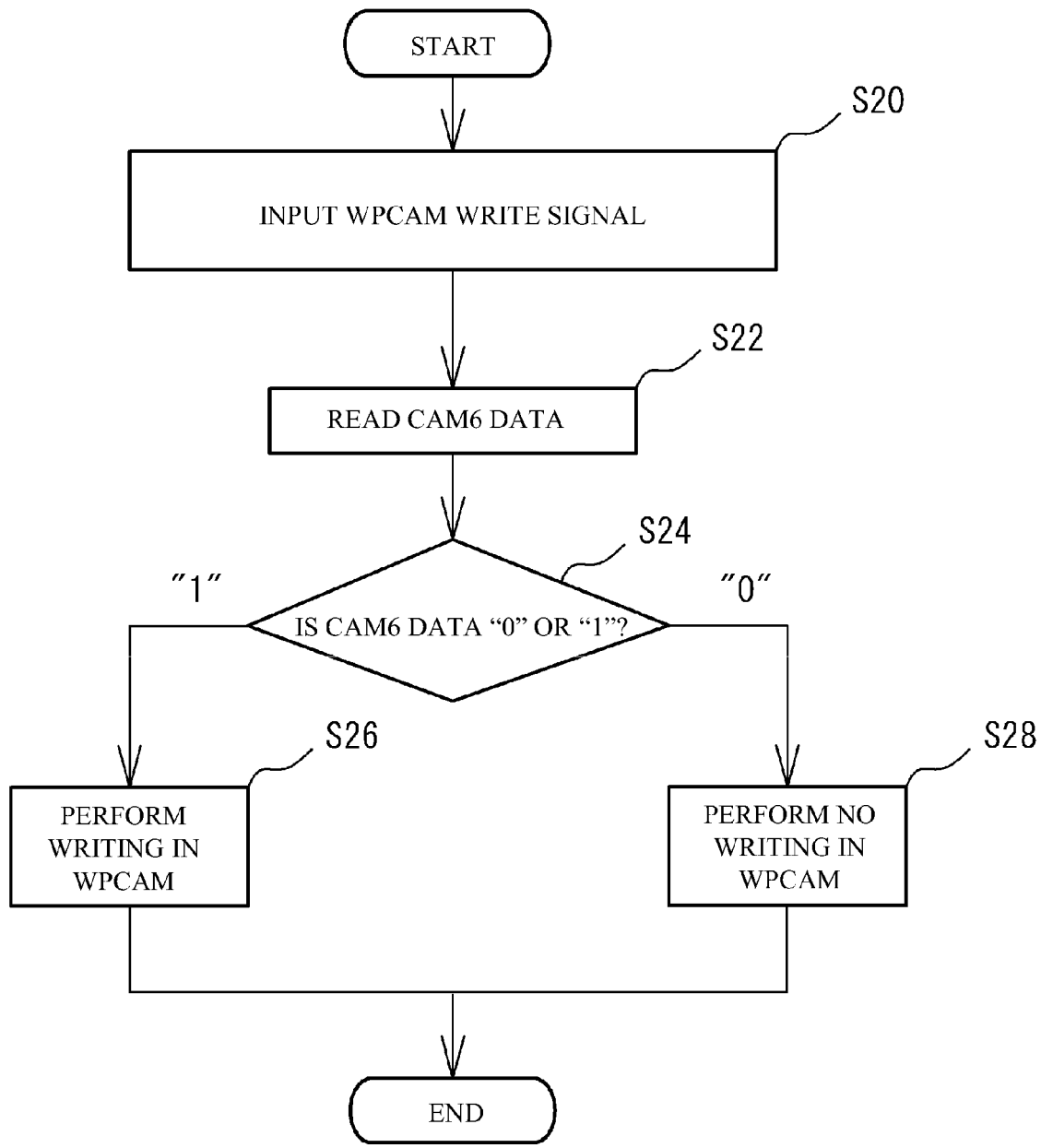
FIG. 5 is a flowchart of an operation to perform writing in a WPCAM of the nonvolatile memory in accordance with the first embodiment.

FIG. 5 is a flowchart of an operation to be performed by the second prohibition information control circuit 61 in a case where writing is performed in a WPCAM 20 (or in a case where the corresponding memory region is switched from a program allowed state to a program prohibited state). As shown in FIG. 5, a WPCAM write signal is input to the second prohibition information control circuit 61 (step S20). The second prohibition information control circuit 61 reads the CAM6 data (the second prohibition information) from the CAM6 (60) (step S22). The second prohibition information control circuit 61 then determines whether the CAM6 data is "0" or "1" (step S24). If the CAM6 data is "1" (an erase state), the second prohibition information control circuit 61 turns the switch 27 on, to allow writing in the WPCAM 20 (step S26). If the CAM6 data is "0" (a write state), the second prohibition information control circuit 61 turns the switch 27 off, to prohibit writing in the WPCAM 20 (step S28).

FIG. 6 shows the actions of the switches 25 and 27 depending on the CAM1 data and the CAM6 data in the nonvolatile memory in accordance with the first embodiment. In a case where the CAM1 data for activating the STB function is "0" (a write state), the switch 25 is turned off, regardless of the CAM6 data. In other words, erasing in the corresponding WPCAM is prohibited (a change of the corresponding memory region from a program prohibited state to a program allowed state is prohibited). If the CAM1 data is "1," the switch 25 is turned on, regardless of the CAM6 data. In other words, erasing in the corresponding WPCAM is allowed (a change of the corresponding memory region from a program prohibited state to a program allowed state is allowed).

In a case where the CAM6 data is "0" (a write state), the switch 27 is turned off, regardless of the CAM1 data. In other words, writing in the corresponding WPCAM is prohibited (a change of the corresponding memory region from a program allowed state to a program prohibited state is prohibited). If the CAM6 data is "1," the switch 27 is turned on, regardless of the CAM1 data. In other words, writing in the corresponding WPCAM is allowed (a change of the corresponding memory region from a program allowed state to a program prohibited state is allowed).

In accordance with the first embodiment, as shown in FIG. 4 and FIG. 6, in a case where there is writing in the corresponding WPCAM (the corresponding memory region is in a program prohibited state), the first prohibition information control circuit 41 prohibits erasing in the WPCAM, based on the CAM1 data (the first prohibition information) (where the CAM1 data is "0," and the program prohibition information indicates that the corresponding memory region should be in a program prohibited state), and then prohibits a change of the program prohibition information from a program prohibiting state to a program allowing state with respect to the corresponding memory region 12. Also, as shown in FIG. 5 and FIG. 6, in a case where writing in the WPCAM is prohibited based on the CAM6 data (the second prohibition information) (where the CAM6 data is "0," indicating that a change of the memory region 12 from a program allowed state to a program prohibited state is prohibited), the second prohibition information control circuit 61 prohibits a change of the program prohibition information from a program allowing state to a program prohibiting state with respect to the corresponding memory region 12. With this structure, when the CAM1 data and the CAM6 data are both "0," the WPCAM data can be fixed. Accordingly, when the STB function is activated, for example, the memory region can be protected from a hacker or the like putting the memory region into a program prohibited state. In this manner, a decrease in the working memory area that hinders a system operation can be prevented.

Figure 7:
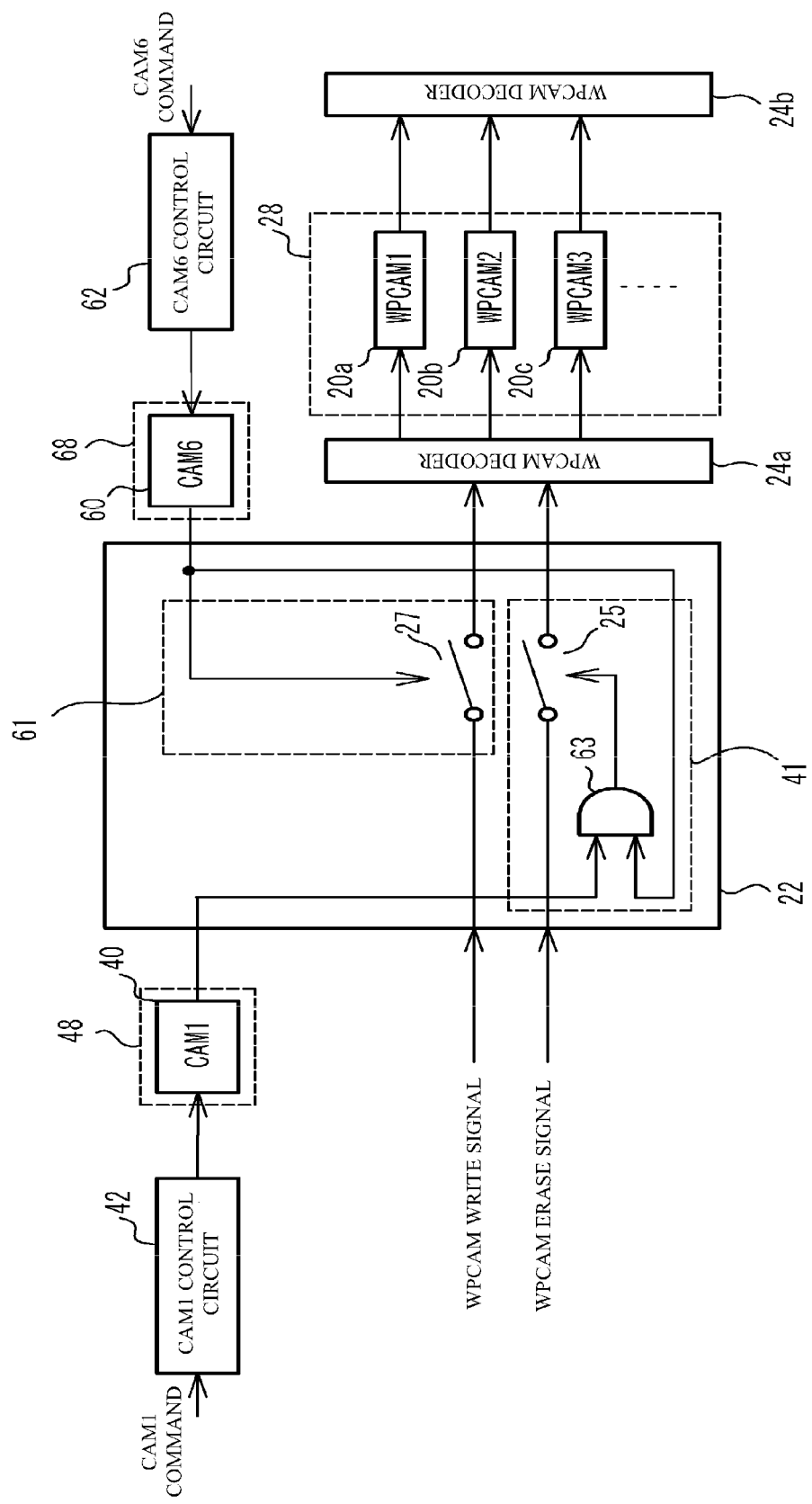
FIG. 7 is a block diagram showing the components surrounding the WPCAM control circuit of a nonvolatile memory in accordance with a second embodiment of the present invention.

A second embodiment of the present invention concerns an example case where the switch 25 is not turned on, regardless of the CAM1 data, if the CAM6 data is "0." As shown in FIG. 7, the first prohibition information control circuit 41 has an AND circuit 63, as well as the switch 25. The CAM1 data and the CAM6 data are input to the AND circuit 63, and the output of the AND circuit 63 is input to the switch 25. The other aspects of this structure are the same as those of the first embodiment shown in FIG. 3, and explanation of them is omitted here.

Figure 8:
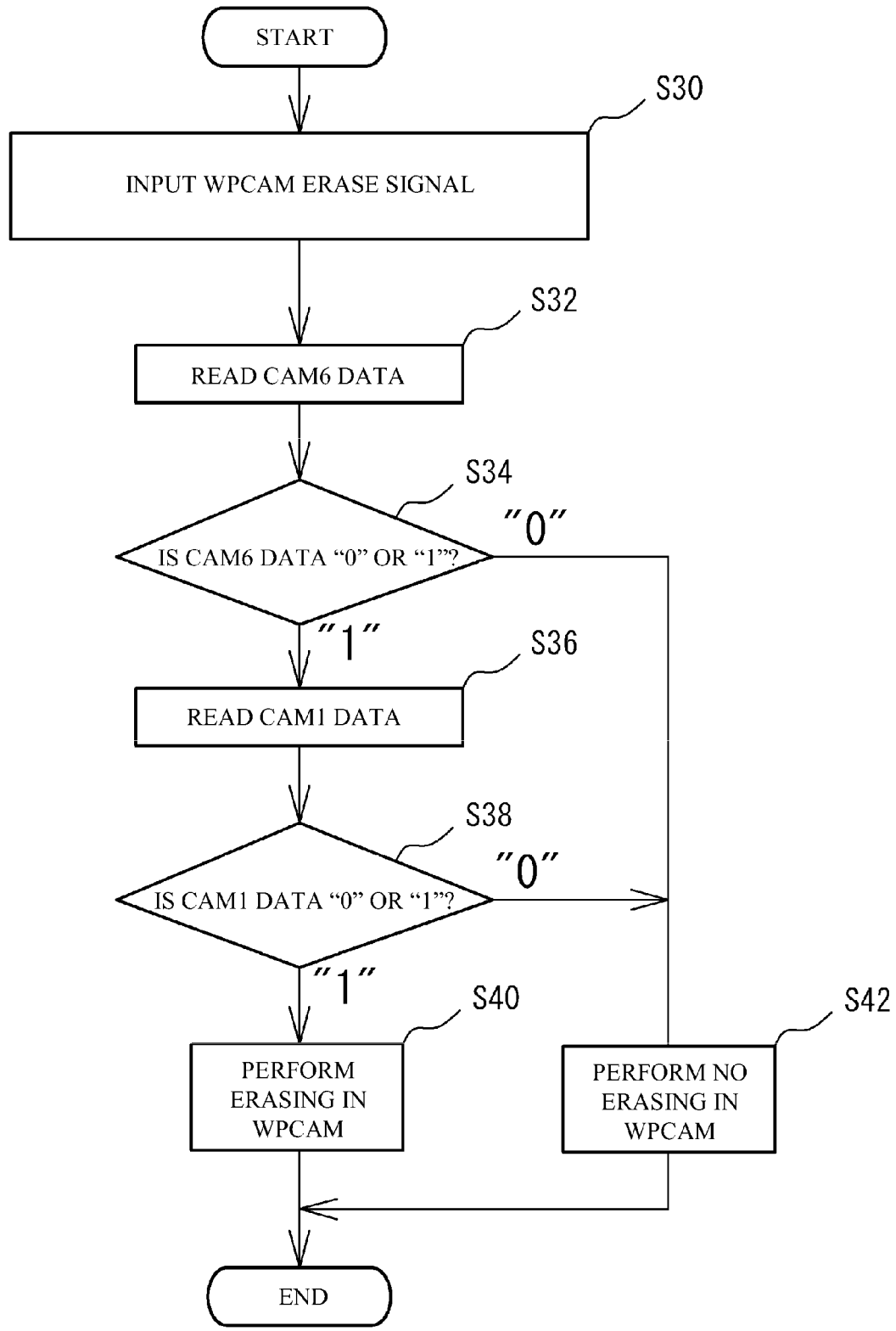
FIG. 8 is a flowchart of an operation to perform erasing in a WPCAM of the nonvolatile memory in accordance with the second embodiment.

FIG. 8 is a flowchart of an operation to be performed by the first prohibition information control circuit 41 in a case where erasing is performed in a WPCAM 20. As shown in FIG. 8, a WPCAM erase signal is input to the first prohibition information control circuit 41 (step S30). The first prohibition information control circuit 41 reads the CAM6 data (the second prohibition information) from the CAM6 (60) (step S32). The first prohibition information control circuit 41 then determines whether the CAM6 data is "0" or "1" (step S34). If the CAM6 data is "0" (a write state), the first prohibition information control circuit 41 turns the switch 25 off, to prohibit erasing in the WPCAM 20 (step S42).

If the CAM6 data is determined to be "1" in step S34, the first prohibition information control circuit 41 reads the CAM1 data (the first prohibition information) from the CAM1 (40) (step S36). The first prohibition information control circuit 41 then determines whether the CAM1 data is "0" or "1" (step S38). If the CAM1 data is "1" (an erase state), the first prohibition information control circuit 41 turns the switch 25 on, to allow erasing in the WPCAM 20 (step S40). If the CAM6 data is "0" (a write state), the first prohibition information control circuit 41 turns the switch 25 off, to prohibit erasing in the WPCAM 20 (step S42).

FIG. 9 shows the actions of the switches 25 and 27 depending on the CAM1 data and the CAM6 data in the nonvolatile memory in accordance with the second embodiment. In a case where the CAM6 data is "0," the switch 25 is turned off, even if the CAM1 data is "1," which is different from the cases shown in FIG. 6. In other words, erasing in the corresponding WPCAM is prohibited (a change of the corresponding memory region from a program prohibited state to a program allowed state is prohibited).

In accordance with the second embodiment, as shown in FIG. 8 and FIG. 9, in a case where the CAM6 data (the second prohibition information) is "0" (or the CAM6 data indicates that a change of the program prohibition information from a program allowing state to a program prohibiting state with respect to the corresponding memory region 12 is prohibited), the first prohibition information control circuit 41 prohibits a change of the program prohibition information from a program prohibiting state to a program allowing state with respect to the corresponding memory region 12, regardless of the CAM1 data (the first prohibition information). Accordingly, if a hacker hacks the STB function and changes the CAM1 data from "0" to "1," the WPCAM data can be prevented from being changed from "0" to "1," and an unauthorized change of the corresponding memory region can be prevented. Thus, a higher-security nonvolatile memory can be provided.

Figure 10:
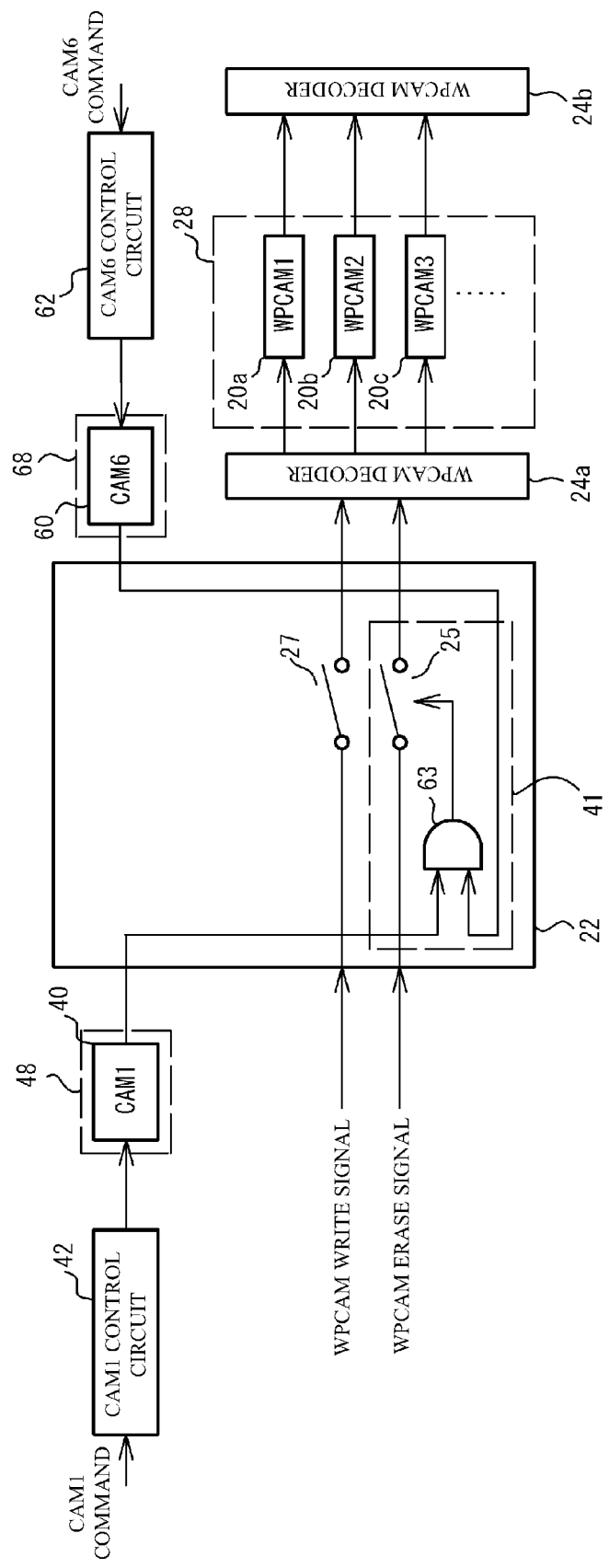
FIG. 10 is a block diagram showing the components surrounding the WPCAM control circuit of a nonvolatile memory in accordance with a modification of the second embodiment.

Although the flash memory in accordance with the second embodiment has the first prohibition information control circuit 41 and the second prohibition information control circuit 61, the flash memory may not have the second prohibition information control circuit 61. FIG. 10 is a block diagram showing the components surrounding the WPCAM control circuit 22 in accordance with a modification of the second embodiment. As shown in FIG. 10, the modification of the second embodiment does not include the second prohibition information control circuit 61, unlike the second embodiment shown in FIG. 7. The other aspects of this structure are the same as those shown in FIG. 7, and explanation of them is omitted here.

In accordance with the modification of the second embodiment, the first prohibition information control circuit 41 is controlled, based on the CAM1 data (the first prohibition information) and fourth prohibition information to be used for determining whether to allow a change of the program prohibition information from a program prohibiting state to a program allowing state with respect to the corresponding memory region 12. In this modification of the second embodiment, the fourth prohibition information is equivalent to the CAM6 data (the second prohibition information). As shown in FIG. 8 and FIG. 9, in a case where the CAM1 data indicates that a change of the memory region 12 from a program prohibited state to a program allowed state is allowed, a change of the program prohibition information from a program prohibiting state to a program allowing state with respect to the corresponding memory region 12 is allowed or not allowed, based on the CAM6 data. In a case where the CAM1 data indicates that a change of the memory region from a program prohibited state to a program allowed state is prohibited, a change of the program prohibition information from a program prohibiting state to a program allowing state with respect to the corresponding memory region 12 is prohibited, regardless of the CAM6 data.

In accordance with the modification of the second embodiment, only where the two independent pieces of information (the first prohibition information and the fourth prohibition information) both allow a change from a program prohibited state to a program allowed state, a change of the program prohibition information from a program prohibiting state to a program allowing state can be allowed. Accordingly, even if one of the two pieces of information is hacked, the program prohibition information cannot be changed, and a higher-security nonvolatile memory can be provided. The second prohibition information may be one piece of information or an output of more than one information logic operation.

In the modification of the second embodiment, it is preferable that the CAM1 command and the CAM6 command are different commands from each other. It is also preferable that the well 28 on which the CAM1 (20) (the first prohibition information memory) and the well 68 on which the CAM6 (60) (the fourth prohibition information memory) are separated from each other. In other words, it is preferable that the means of erasing the CAM1 data is different from the means of erasing the CAM6 data. Accordingly, the two pieces of information (the first prohibition information and the fourth prohibition information) to be controlled independently of each other can be protected from hacking. Thus, a higher-security nonvolatile memory can be provided.

Figure 11:
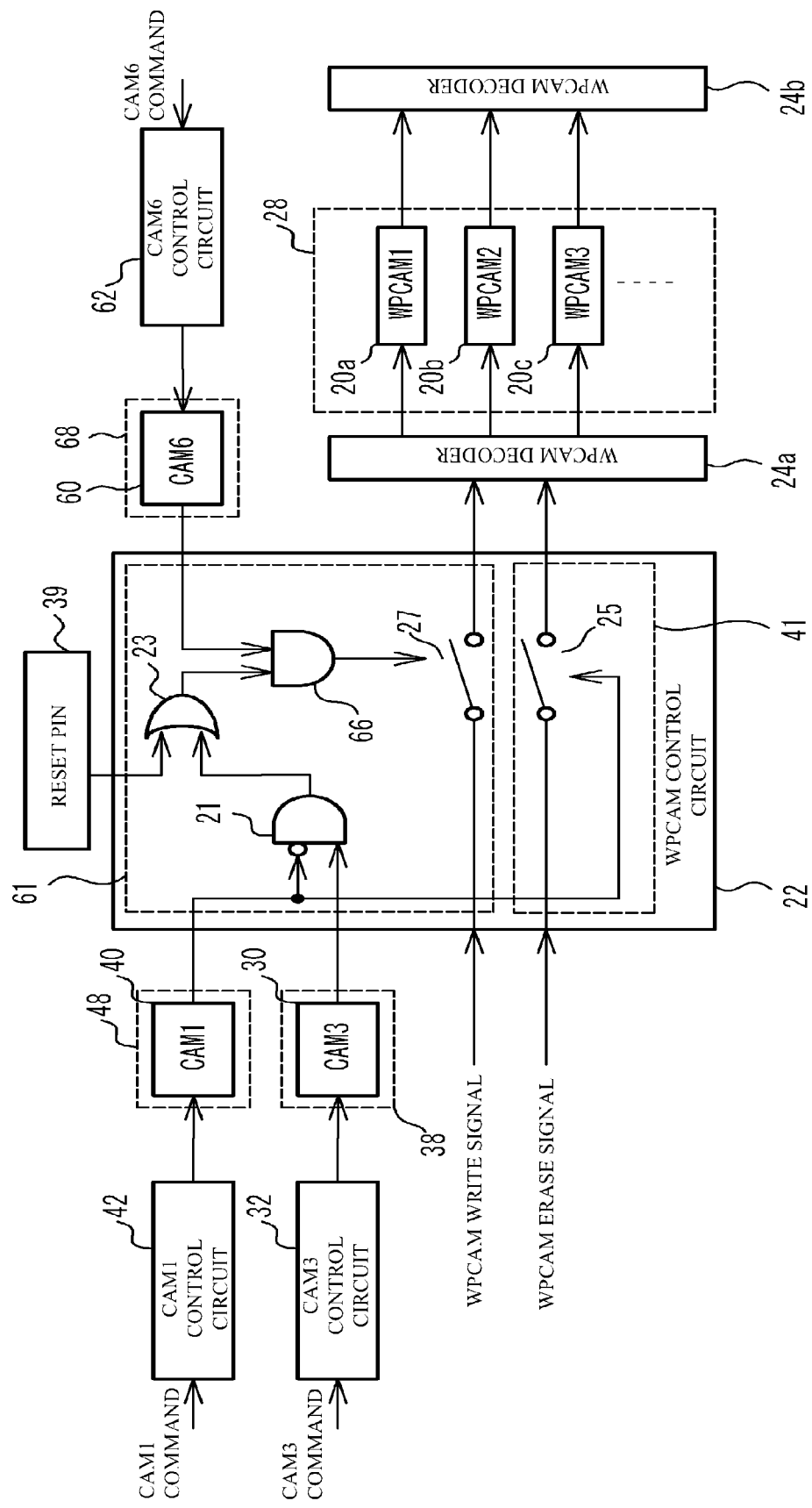
FIG. 11 is a block diagram showing the components surrounding the WPCAM control circuit of a nonvolatile memory in accordance with a third embodiment of the present invention.

A third embodiment of the present invention is an example of a nonvolatile memory that has an auxiliary input terminal for applying a high voltage. FIG. 11 is a block diagram showing the components surrounding the WPCAM control circuit 22. The same components as those of the first embodiment shown in FIG. 3 are denoted by the same reference numerals as those in FIG. 3, and explanation of them is omitted here. A CAM3 (30) and a reset pin 39, as well as the CAM1 (40) and the CAM6 (60), are connected to the WPCAM control circuit 22. Based on the data supplied from the CAM1 (40), the CAM3 (30), the CAM6 (60), and the reset pin 39, the second prohibition information control circuit 61 controls the switch 27.

The reset pin 39 is an auxiliary input terminal (also referred to simply as the input terminal) that inputs auxiliary program prohibition information (reset pin data) to be used for determining whether to allow a change of the WPCAM data (the program prohibition information) from a program allowing state to a program prohibiting state with respect to the corresponding memory region 12. In the third embodiment, a higher voltage than an external source voltage is applied to the reset pin 39. Therefore, a high-voltage determining circuit (not shown) for determining whether a high voltage is applied is connected to the reset pin 39. The high-voltage determining circuit determines whether a high voltage is applied to the reset pin 39, and outputs the auxiliary program prohibition information (the reset pin data). The CAM3 (30) is a nonvolatile auxiliary information nullifying information memory, and stores auxiliary information nullifying information (CAM3 data) to be used for determining whether to nullify the reset pin data.

The second prohibition information control circuit 61 includes AND circuits 21 and 66, and an OR circuit 23. The AND circuit 21 performs an AND operation between inversed CAM1 data and the CAM3 data. The OR circuit 23 performs an OR operation between the reset pin data and the output of the AND circuit 21. The AND circuit 66 performs an AND operation between the output of the OR circuit 23 and the CAM6 data, and outputs the result to the switch 27.

Figure 12:
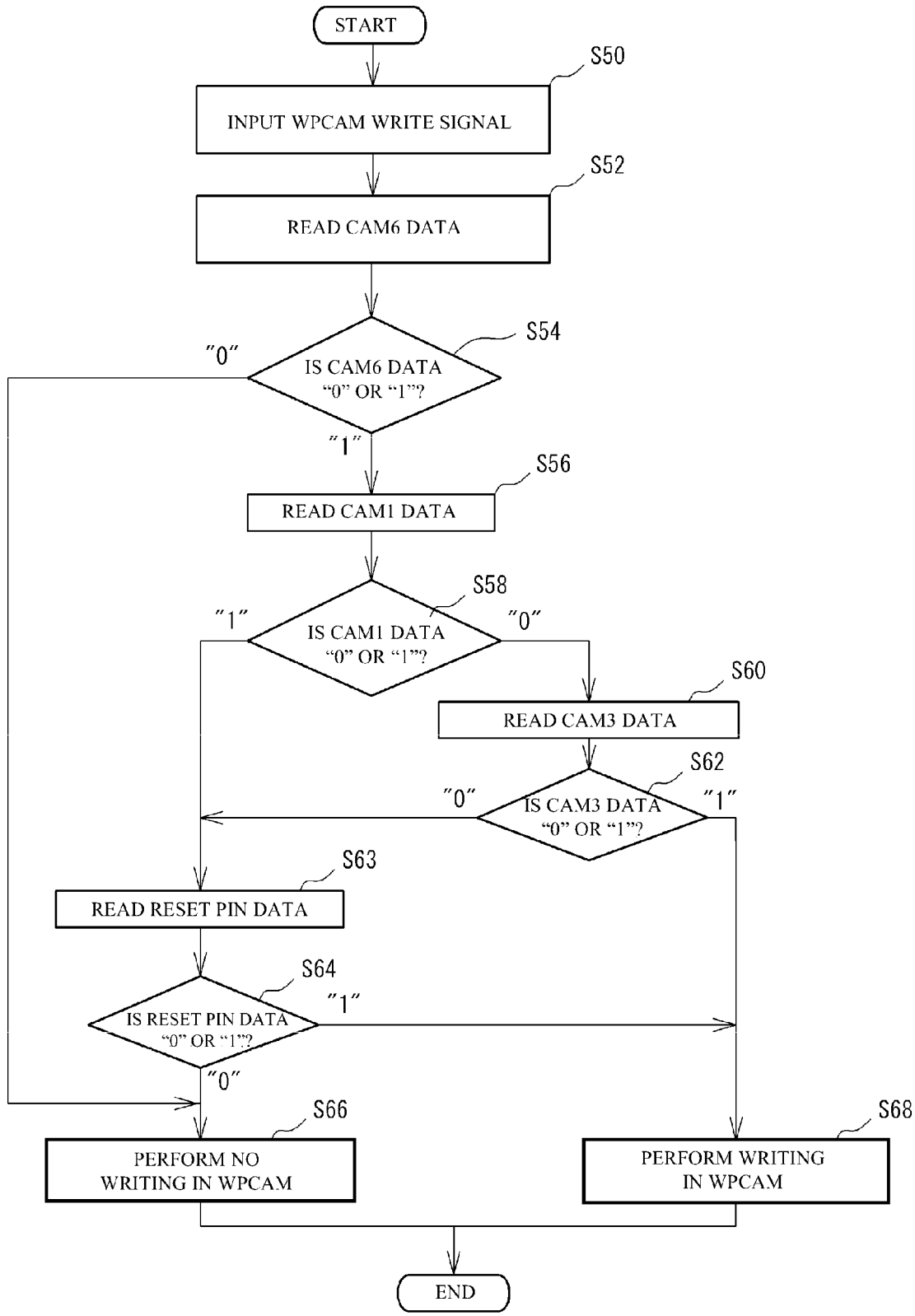
FIG. 12 is a flowchart of an operation to perform writing in a WPCAM of the nonvolatile memory in accordance with the third embodiment.

FIG. 12 is a flowchart of an operation to be performed by the second prohibition information control circuit 61 in a case where writing is to be performed in a WPCAM 20 (or the corresponding memory region is to be changed from a program allowed state to a program prohibited state).

As shown in FIG. 12, a WPCAM write signal is input to the second prohibition information control circuit 61 (step S50). The second prohibition information control circuit 61 reads the CAM6 data (the second prohibition information) from the CAM6 (60) (step S52). The second prohibition information control circuit 61 then determines whether the CAM6 data is "0" or "1" (step S54). If the CAM6 data is "0" (a write state), the second prohibition information control circuit 61 turns the switch 27 off, to prohibit writing in the WPCAM 20 (step S66). If the CAM6 data is determined to be "1" (an erase state) in step S54, the second prohibition information control circuit 61 reads the CAM1 data (the first prohibition information) from the CAM1 (40) (step S56). The second prohibition information control circuit 61 then determines whether the CAM1 data is "0" or "1" (step S58). If the CAM1 data is "0" (a write state), the second prohibition information control circuit 61 reads the CAM3 data (the auxiliary information nullifying information) from the CAM3 (30) (step S60). The second prohibition information control circuit 61 then determines whether the CAM3 data is "0" or "1" (step S62). If the CAM3 data is "1" (an erase state), the second prohibition information control circuit 61 turns the switch 27 on, to allow writing in the WPCAM 20 (step S68).

If the CAM1 data is determined to be "1" (an erase state) in step S58 or the CAM3 data is determined to be "0" (a write state) in step S62, the second prohibition information control circuit 61 reads the reset pin data (the auxiliary program prohibition information) from the reset pin 39 (step S63). If a high voltage (such as a voltage of 12 V) is applied to the reset pin 39, the reset pin data is "1." If a high voltage is not applied to the reset pin 39, the reset pin data is "0." The second prohibition information control circuit 61 then determines whether the reset pin data is "0" or "1" (step S64). If the reset pin data is "1," the second prohibition information control circuit 61 turns the switch 27 on, to allow writing in the WPCAM 20 (step S68). If the reset pin data is "0," the second prohibition information control circuit 61 turns the switch 27 off, not to allow writing in the WPCAM 20 (step S66).

In a case where erasing is to be performed in the WPCAM 20 (or in a case where the corresponding memory region is to be changed from a program prohibited state to a program allowed state), the operation to be performed by the first prohibition information control circuit 41 is the same as the operation of the first embodiment shown in FIG. 4, regardless of the CAM3 data, the CAM6 data, and the reset pin data, and therefore, explanation of the operation is omitted here.

FIG. 13 shows the above described operations. In a case where the CAM6 data is "0," the actions of the switches 25 and 27 are the same as those of the first embodiment shown in FIG. 6, regardless of the CAM3 data and the reset pin data.

In a case where the CAM6 data is "1," the following operation is performed. In a case where the STB function is not activated (or the CAM1 data is "1") and the high voltage is applied to the reset pin 39 (or the auxiliary program prohibition information (the reset pin data) is "1"), or in a case where the STB function is activated (or the CAM1 data is "0"), the auxiliary information nullifying information is valid (or the CAM3 data is "0"), and the high voltage is applied to the reset pin 39 (or the auxiliary program prohibition information (the reset pin data) is "1"), the switch 27 is turned on when a WPCAM write signal is input, and writing is performed in the WPCAM 20. If a voltage is not applied to the reset pin 39 (or the reset pin data is "0"), the switch 27 remains off even when a WPCAM write signal is input, and writing is not performed in the WPCAM 20 in principle. However, in a case where the STB function is activated (or the CAM1 data is "0") and the auxiliary information nullifying information is invalid (or the CAM3 data is "1"), the switch 27 is turned on in an exceptional action, regardless of the auxiliary program prohibition information (the reset pin data), and writing is performed in the WPCAM 20 when a WPCAM write signal is input. In other words, the auxiliary information nullifying information is nullified (the CAM3 data is made "1") when the STB function is activated, so that writing can be performed in the corresponding WPCAM 20 (or the corresponding memory region is put into a program prohibited state) without a high voltage applied to the reset pin 39.

In a case where the CAM1 data for activating the STB function is "0" (a write state), the switch 27 is turned on to allow writing in the WPCAM 20, depending on the CAM3 data (the auxiliary information nullifying information). In a case where the CAM3 data is "1" (an erase state), the WPCAM control circuit 22 nullifies the reset pin data. In a case where the CAM3 data is "0" (a write state), the WPCAM control circuit 22 makes the reset pin data valid.

In the nonvolatile memory in accordance with the third embodiment, as described with reference to FIG. 12 and FIG. 13, the second prohibition information control circuit 61 allows or does not allow a change of the program prohibition information from a program allowing state to a program prohibiting state with respect to the corresponding memory region 12, based on the CAM3 data (the auxiliary information nullifying information) to be used for determining whether to nullify the reset pin data (the auxiliary program prohibition information) in a case where the CAME data is "1," and based on the reset pin data in a case where the CAM3 data is valid "0." In a case where the CAM3 data is invalid ("1"), the second prohibition information control circuit 61 allows a change of the program prohibition information from a program allowing state to a program prohibiting state with respect to the corresponding memory region 12, regardless of the reset pin data. Accordingly, whether a signal is applied to the reset pin 39 can be selected or not selected as the condition for changing the WPDAM data from a program allowing state to a program prohibiting state. Here, the signal to be input to the reset pin 39 is not limited to a high voltage. The application of a high voltage is not generally a voltage requirement for a system substrate having a semiconductor device mounted thereon on the end user side, as long as there is an input terminal to which the auxiliary program prohibition information to be used for determining whether to allow a change of the content of the WPCAM data from program allowing data to program prohibiting data is input.

In this embodiment, the auxiliary information nullifying information memory (the CAM3 (30)) that stores the CAM3 data (the auxiliary information nullifying information) is provided. Further, the second prohibition information memory (the CAM6 (60)) that stores the CAM6 data (the second prohibition information) is provided. With those components, the CAM3 (30) and the CAM6 (60) are arbitrarily set by an authorized user or at the time of shipment from the factory, for example. In this manner, a nonvolatile memory that satisfies user requirements can be provided.

In FIG. 13, in a case where the CAM1 data is "0," the WPCAM control circuit 22 (the prohibition information control circuit) prohibits programming in the memory region 12 corresponding to the program prohibition information of the WPCAM 20, and then prohibits a change of the program prohibition information from a program prohibiting state to a program allowing state with respect to the corresponding memory region 12. As shown in step S10 of FIG. 4, even when a WPCAM erase signal is input, erasing is not performed in the WPCAM 20 as in step S18 (or the WPCAM data is not changed to "1"). Accordingly, the memory region 12 corresponding to the WPCAM 20 remains in a program prohibited state. Thus, the corresponding memory region 12 can be turned into a ROM, and the security level can be made higher.

Further, as shown in FIG. 12 and FIG. 13, in a case where the CAM1 data (the first prohibition information) does not prohibit a change from a program prohibiting state to a program allowing state, a change of the program prohibition information from a program allowing state to a program prohibiting state with respect to the corresponding memory region 12 is allowed or not allowed, based on the reset pin data (the auxiliary program prohibition information), regardless of the CAM3 data (the auxiliary information nullifying information). In other words, in a case where the CAM1 data is "1" in FIG. 13, the switch 27 is turned on when the reset pin data is "1," and the switch 27 is turned off when the reset pin data is "0," regardless of whether the CAM3 data is "0" or "1."

In accordance with the third embodiment, in a case where the CAM1 data is "1," the CAM3 data does not have any influence. In such a case, writing or erasing is performed in a WPCAM 20, so that the corresponding memory region 12 can be switched between a program prohibited state and a program allowed state. As a result, the security level is low.

As the CAM1 data is set at "0," writing is performed in the WPCAM 20, and the corresponding memory region 12 is changed from a program allowed state to a program prohibited state. Since erasing cannot be performed in the WPCAM 20, the memory region 12 cannot be put back into a program allowed state. Thus, the security level becomes higher.

Further, as the CAM3 data is set at "1," writing can be performed in the WPCAM 20, and the corresponding memory region 12 can be easily put into a program prohibited state with a higher security level, regardless of the signal application to the reset pin 39. Accordingly, the memory region 12 can be put into a program prohibited state, with the use of a communication line, for example. In this manner, the security level can be made higher, without a high-voltage circuit provided on the system substrate on the end user side or a large number of signal setting terminals provided on the communication line.

Further, as the CAM6 is set at "0," writing cannot be performed in the WPCAM 20, regardless of the CAM1 data and the CAM3 data. In other words, the corresponding memory region 12 cannot be changed from a program allowed state to a program prohibited state. Thus, the security level can be made even higher. As the CAM1 (40), the CAM3 (30), and the CAM6 (60) are set in the above described manner, the nonvolatile memory can satisfy the requirements of the application to be used, and set a high security level.

Figure 14:
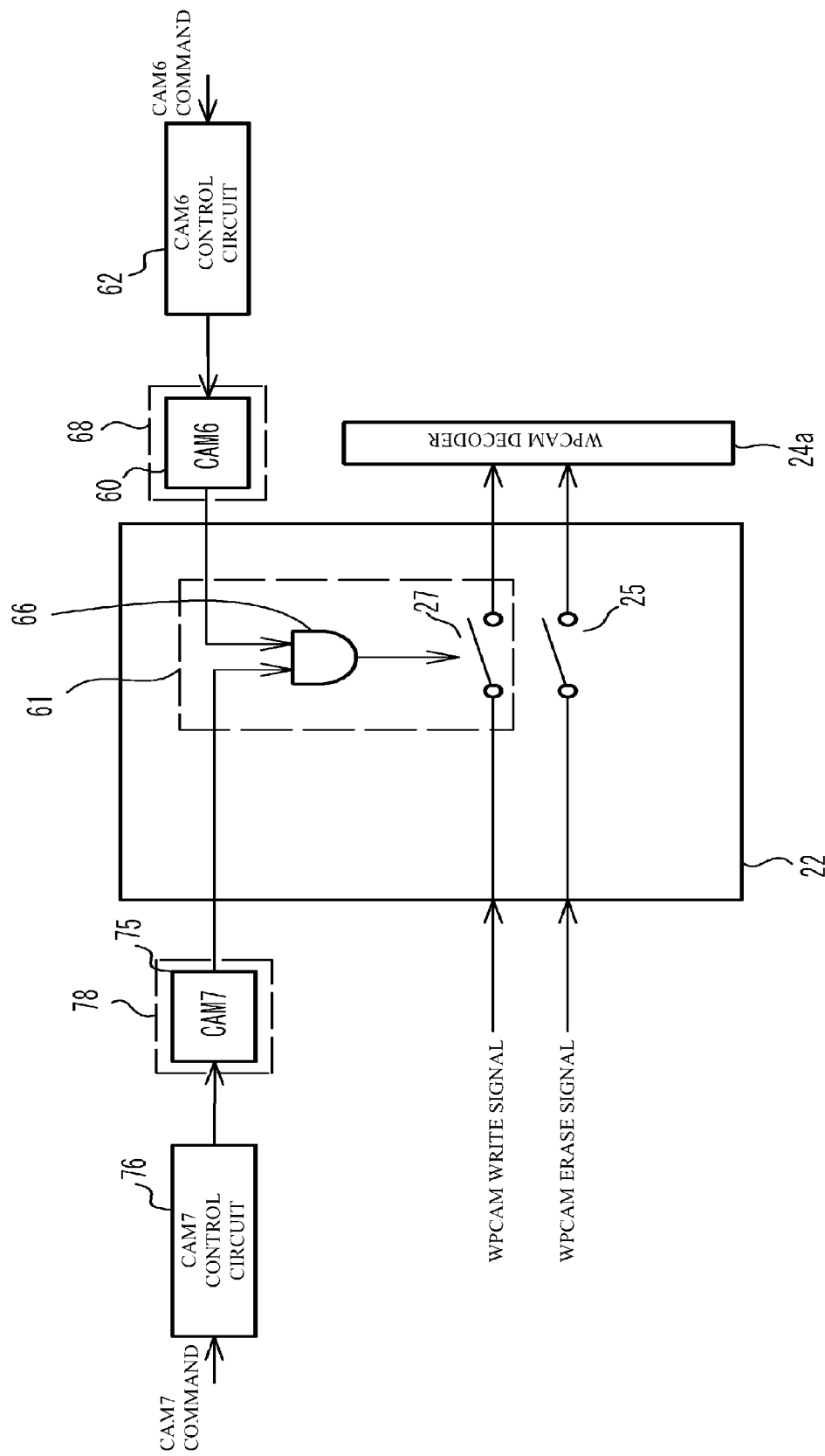
FIG. 14 is a block diagram showing the components surrounding the WPCAM control circuit of a nonvolatile memory in accordance with a modification of the third embodiment.

Although the flash memory in accordance with the third embodiment includes the first prohibition information control circuit 41 and the second prohibition information control circuit 61, it may not include the first prohibition information control circuit 41. FIG. 14 is a block diagram showing the components surrounding the WPCAM control circuit in accordance with a modification of the third embodiment. As shown in FIG. 14, the modification of the third embodiment differs from the structure of the third embodiment shown in FIG. 13, in that the second prohibition information control circuit 61 has an AND circuit 66 to which CAM7 data is input from a CAM7 (75). A CAM7 control command is input to a CAM7 control circuit 76, and the CAM7 control circuit 76 programs the CAM7 (75). This modification does not include the first prohibition information control circuit 41. The other aspects of this structure are the same as those of the structure shown in FIG. 13, and explanation of them is omitted here.

In accordance with the modification of the third embodiment, the second prohibition information control circuit 61 is controlled, based on the CAM6 data (the second prohibition information) and the CAM7 data (third prohibition information) to be used for determining whether to allow a change of the program prohibition information from a program allowing state to a program prohibiting state with respect to the corresponding memory region 12. In a case where the CAM6 data allows a change of the memory region 12 from a program allowed state to a program prohibited state, the second prohibition information control circuit 61 allows or does not allow a change of the program prohibition information from a program allowing state to a program prohibiting state with respect to the corresponding memory region 12, based on the CAM7 data. In a case where the CAM6 data prohibits a change of the memory region 12 from a program allowed state to a program prohibited state, the second prohibition information control circuit 61 prohibits a change of the program prohibition information from a program allowing state to a program prohibiting state with respect to the corresponding memory region 12, regardless of the CAM7 data.

In accordance with the modification of the third embodiment, only where the two independent pieces of information (the second prohibition information and the third prohibition information) both allow a change from a program allowing state to a program prohibiting state, a change of the program prohibition information from a program allowing state to a program prohibiting state can be allowed. Accordingly, even if one of the two pieces of information is hacked, the program prohibition information cannot be changed, and a higher-security nonvolatile memory can be provided. The third prohibition information may not be information stored in a memory such as the CAM7 (75), but may be information that is input from an input terminal such as the reset pin 39. The third prohibition information may be one piece of information or an output of more than one information logic operation.

In the modification of the third embodiment, it is preferable that the CAM6 command and the CAM7 command are different commands from each other. It is also preferable that the well 68 on which the CAM6 (60) (the second prohibition information memory) and the well 78 on which the CAM7 (75) (the third prohibition information memory) are separated from each other. In other words, it is preferable that the means of erasing the CAM6 data is different from the means of erasing the CAM7 data. Accordingly, the two pieces of information (the second prohibition information and the third prohibition information) to be controlled independently of each other can be protected from hacking. Thus, a higher-security nonvolatile memory can be provided.

Figure 15:
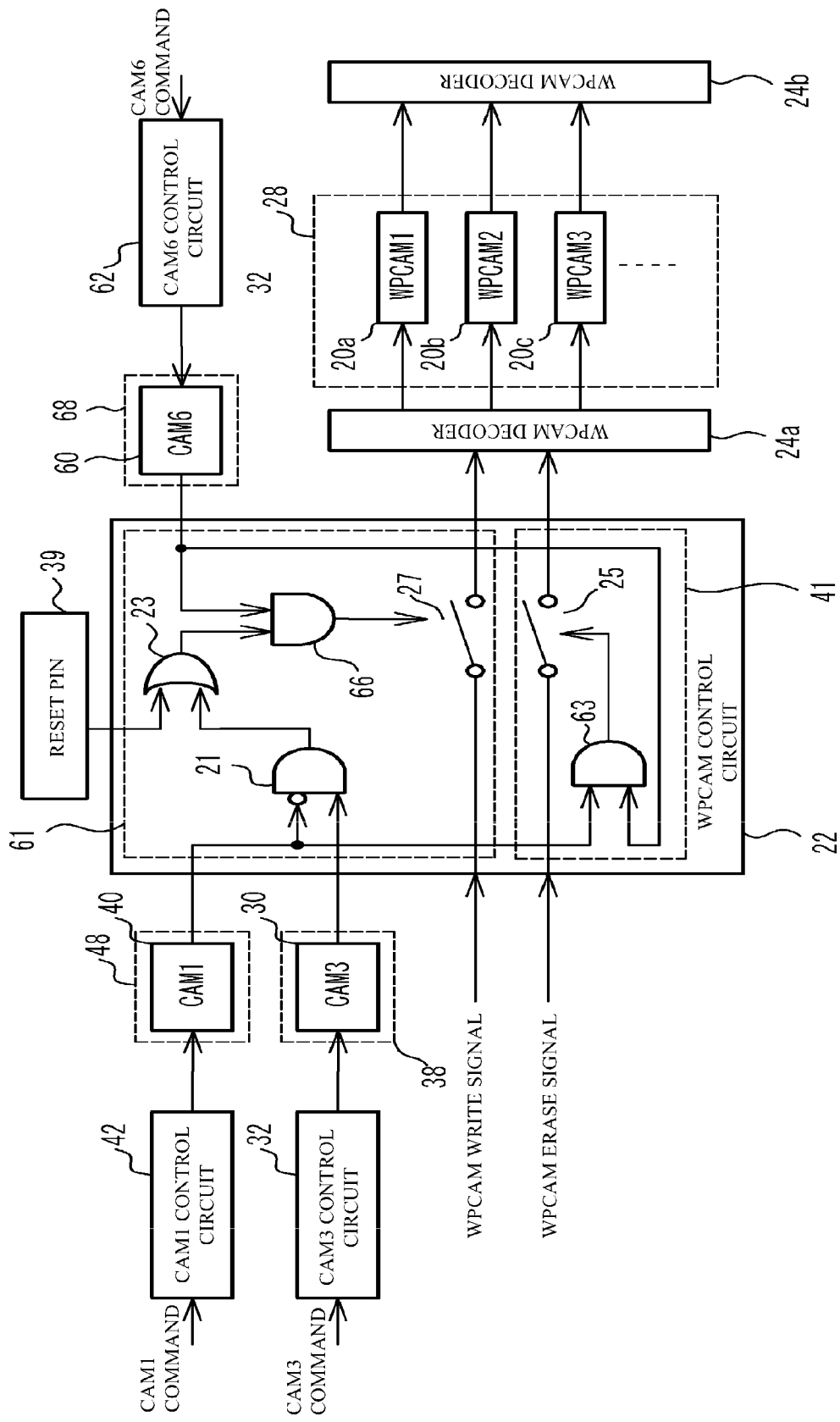
FIG. 15 is a block diagram showing the components surrounding the WPCAM control circuit of a nonvolatile memory in accordance with a fourth embodiment of the present invention.

A fourth embodiment of the present invention concerns an example where the switch 25 is not turned on when the CAM6 data is "0," regardless of the CAM1 data. As shown in FIG. 15, the first prohibition information control circuit 41 has an AND circuit 63 as well as the switch 25. The CAM1 data and the CAM6 data are input to the AND circuit 63, and the output of the AND circuit 63 is input to the switch 25. The other aspects of this structure are the same as those of the third embodiment shown in FIG. 11, and explanation of them is omitted here.

The operation of the first prohibition information control circuit 41 of the fourth embodiment is the same as the operation of the second embodiment shown in FIG. 8, and the operation of the second prohibition information control circuit 61 of the fourth embodiment is the same as the operation of the third embodiment shown in FIG. 12. FIG. 16 collectively shows the operations of the first prohibition information control circuit 41 and the second prohibition information control circuit 61. The operations shown in FIG. 16 differ from the operations of the third embodiment shown in FIG. 13 in that, in a case where the CAM6 data is "0," the switch 27 is turned off when the CAM1 data is "1." The other aspects of the operations are the same as those of the third embodiment shown in FIG. 13, and explanation of them is omitted here.

In accordance with the fourth embodiment, as in the second embodiment, in a case where the CAM6 data is "0," erasing and writing in the WPCAM can be prohibited. Accordingly, if a hacker hacks the STB function and changes the CAM1 data from "0" to "1," the WPCAM data can be prevented from being changed from "0" to "1," and an unauthorized change of the corresponding memory region can be prevented. Thus, a higher-security nonvolatile memory can be provided.

In the first through fourth embodiments, the WPCAM command to be input to the WPCAM control circuit 22 that controls the WPCAMs 20 is different from the CAM6 command to be input to the CAM6 control circuit 62 that controls the CAM6 (60). Accordingly, the WPCAMs 20 use a different command from the command used by the CAM6 (60). Thus, the CAM6 (60) and each WPCAM 20 are controlled independently of each other, and rewrite of the CAM6 data in the CAM6 (60) by a hacker can be more effectively prevented.

Each WPCAM 20 and the CAM6 (60) are formed on the different wells 28 and 68 in the semiconductor substrate on which the nonvolatile memory cell is formed. More specifically, the WPCAMs 20 are formed on the well 28 in the semiconductor substrate, and the CAM6 (60) is formed on the well 68 isolated from the well 28 in the semiconductor substrate. In a case where data erasing is to be performed in the WPCAMs 20 and the CAM6 (60) by applying a voltage between a control gate and a well, and utilizing the FN tunneling phenomenon, the WPCAM data and the CAM6 data might be erased at the same time if the wells 28 and 68 for the WPCAMs 20 and the CAM6 (60) are a common well. With the different wells 28 and 68 as the erasing means, simultaneous erasing of the WPCAM data and the CAM6 data is prevented, and a high-security nonvolatile memory can be realized.

The above example case is a case where the means of erasing the WPCAM data and the means of erasing the CAM6 data are made different from each other by forming the WPCAMs 20 and the CAM6 on the different wells 28 and 68 in the semiconductor substrate. The erasing means can be varied by employing different high-voltage generating circuits or varying the physical structures of the erasing means of erasing data. Alternatively, different data erasing methods may be employed. For example, a FN tunneling phenomenon may be utilized for erasing either the WPCAM data or the CAM6 data, and hot hole injection may be performed for erasing the other. As described above, to vary the means of erasing data is to vary the physical structures for erasing data or varying the data erasing methods. Accordingly, simultaneous erasing of the WPCAM data and the CAM6 data can be prevented, and a high-security nonvolatile memory can be realized.

Likewise, it is preferable that the WPCAM command and the CAM3 command are different commands from each other. It is also preferable that the well 28 on which the WPCAMs 20 are formed is isolated from the well 38 on which the CAM3 (30) is formed. In other words, it is preferable that the means of erasing the WPCAM data is different from the means of erasing the CAM3 data. It is also preferable that the CAM3 command and the CAM6 command are different commands from each other. It is preferable that the well 38 on which the CAM3 (30) is formed is isolated from the well 68 on which the CAM6 (60) is formed. In other words, it is preferable that the means of erasing the CAM3 data is different from the means of erasing the CAM6 data. It is also preferable that the CAM1 command and the CAM6 command are different commands from each other. It is preferable that the well 48 on which the CAM1 (40) is formed is isolated from the well 68 on which the CAM6 (60) is formed. In other words, it is preferable that the means of erasing the CAM1 data is different from the means of erasing the CAM6 data. With this arrangement, a high-security nonvolatile memory can be realized.

In FIG. 4, FIG. 5, FIG. 8, and FIG. 12 concerning the first through fourth embodiments, the timing for reading the CAM1 data, the CAM3 data, or the CAM6 data is not limited to the timing shown in those flowcharts. For example, the CAM1 data, the CAM3 data, and the CAM6 data may be read out when power is supplied to the nonvolatile memory. Also, the data reading order is not limited to the order shown in the flowcharts.

Now, several aspects of the present invention are briefly summarized below.

According to an aspect of the present invention, a semiconductor device includes: a plurality of memory regions that include nonvolatile memory cells; a plurality of program prohibition information units that are provided for the respective memory regions, each of the program prohibition information units storing program prohibition information to be used for determining whether to prohibit or allow programming in each corresponding one of the memory regions; a first prohibition information control circuit that prohibits a change of the program prohibition information from a program prohibiting state to a program allowing state with respect to the corresponding one of the memory regions, based on first prohibition information to be used for determining whether to prohibit a change of the program prohibition information from a program prohibiting state to a program allowing state with respect to the corresponding memory region; and a second prohibition information control circuit that prohibits a change of the program prohibition information from a program allowing state to a program prohibiting state with respect to the corresponding memory region, based on second prohibition information to be used for determining whether to prohibit a change of the program prohibition information from a program allowing state to a program prohibiting state with respect to the corresponding memory region.

The above semiconductor device may further include a second prohibition information memory that stores the second prohibition information. In this device, the program prohibition information units may use a different command from a command used by the second prohibition information memory. The program prohibition information units may also use a different erasing unit for erasing the program prohibition information from an erasing unit used for erasing the second prohibition information by the second prohibition information memory. The semiconductor device may further include a first prohibition information memory that stores the first prohibition information, wherein an erasing unit for erasing the first prohibition information in the first prohibition information memory is different from an erasing unit for erasing the second prohibition information in the second prohibition information memory. The semiconductor device may further include a first prohibition information memory that stores the first prohibition information, wherein the first prohibition information memory is provided on a first well in a semiconductor substrate, and wherein the second prohibition information memory is provided on a second well in the semiconductor substrate, the second well being isolated from the first well.

The semiconductor device may further include: an auxiliary information nullifying information memory that stores the auxiliary information nullifying information; and a second prohibition information memory that stores the second prohibition information, wherein the auxiliary information nullifying information memory uses a different command from a command used by the second prohibition information memory.

The semiconductor device may further include: an auxiliary information nullifying information memory that stores the auxiliary information nullifying information; and a second prohibition information memory that stores the second prohibition information, wherein the auxiliary information nullifying information memory is provided on a well in a semiconductor substrate, and wherein the second prohibition information memory is provided on another well in the semiconductor substrate, the another well being isolated from the well.

According to another aspect of the present invention, there is provided a semiconductor device including: a plurality of memory regions that include nonvolatile memory cells; a plurality of program prohibition information units that are provided for the respective memory regions, each of the program prohibition information units storing program prohibition information to be used for determining whether to prohibit or allow programming in each corresponding one of the memory regions; and a second prohibition information control circuit that prohibits a change of the program prohibition information from a program allowing state to a program prohibiting state with respect to the corresponding memory region, based on second prohibition information to be used for determining whether to prohibit a change of the program prohibition information from a program allowing state to a program prohibiting state with respect to the corresponding memory region, wherein, when the second prohibition information allows a change of the memory region from a program allowed state to a program prohibited state, the second prohibition information control circuit allows or does not allow a change of the program prohibition information from a program allowing state to a program prohibiting state with respect to the corresponding memory region, based on third prohibition information to be used for determining whether to allow a change of the program prohibition information from a program allowing state to a program prohibiting state with respect to the corresponding memory region, and wherein, when the second prohibition information prohibits a change of the memory region from a program allowed state to a program prohibited state, the second prohibition information control circuit prohibits a change of the program prohibition information from a program allowing state to a program prohibiting state with respect to the corresponding memory region, regardless of the third prohibition information.

The above semiconductor device may further include: a second prohibition information memory that stores the second prohibition information; and a third prohibition information memory that stores the third prohibition information, wherein the second prohibition information memory uses a different command from a command used by the third prohibition information memory. The semiconductor device may further include: a second prohibition information memory that stores the second prohibition information; and a third prohibition information memory that stores the third prohibition information, wherein an erasing unit for erasing the second prohibition information in the second prohibition information memory is different from an erasing unit for erasing the third prohibition information in the third prohibition information memory. The semiconductor device may further include: a second prohibition information memory that stores the second prohibition information; and a third prohibition information memory that stores the third prohibition information, wherein the second prohibition information memory is provided on a well in a semiconductor substrate, and wherein the third prohibition information memory is provided on another well in the semiconductor substrate, the another well being isolated from the well.

Although a few preferred embodiments of the present invention have been shown and described, it would be appreciated by those skilled in the art that changes may be made in these embodiments without departing from the principles and spirit of the invention, the scope of which is defined in the claims and their equivalents.

We claim:

1. A semiconductor device comprising:
   a memory cell array comprising a plurality of memory regions;
   a plurality of write protect content addressable memories (WPCAMs) corresponding to the plurality of memory regions and containing program prohibition information used to determine whether programming in a corresponding memory region is prohibited or allowed;
   a plurality of content addressable memories (CAMs) including a first CAM and a second CAM, the plurality of CAMs being configured to contain prohibition information used to determine whether changing the program prohibition information in a WPCAM is prohibited or allowed;
   a write protected content addressable memory (WPCAM) control circuit, configured to reference prohibition information contained in the plurality of CAMs and operable to prohibit a change of the program prohibition information in a WPCAM based on the prohibition information; and
   a program control circuit configured to program the plurality of memory regions,
   wherein the WPCAM control circuit receives as input a WPCAM command and prohibition information from the first CAM to prohibit or allow programming of a WPCAM of the plurality of WPCAMs,
   further wherein the program control circuit is configured to prohibit or allow programming a memory region based on the program prohibition information contained in the WPCAM corresponding to the memory region.

2. The semiconductor device according to claim 1, wherein the WPCAM control circuit comprises a plurality of prohibition information control circuits including a first prohibition information control circuit and a second prohibition information control circuit, the plurality of prohibition information control circuits being operable to receive prohibition information from the CAMs and prohibit or allow writing and erasing to the WPCAMs based on the prohibition information received from the CAMs.

3. The semiconductor device according to claim 2, wherein the first prohibition information control circuit is configured to read prohibition information from the first CAM and to prohibit erasing in a WPCAM unless a WPCAM erase signal is received as input and the first prohibition information corresponds to an erase state.

4. The semiconductor device according to claim 3, wherein the first prohibition information control circuit comprises a first switch, wherein erasing in a WPCAM is allowed only when the first switch is turned on.

5. The semiconductor device according to claim 4, wherein the first switch is turned off when the prohibition information in the first CAM corresponds to a write state, and turned on when the prohibition information in the first CAM corresponds to an erase state.

6. The semiconductor device according to claim 5, wherein the first switch is turned off when the prohibition information in the first CAM corresponds to a write state, and turned on when the prohibition information in the first CAM corresponds to an erase state, regardless of the prohibition information in the second CAM.

7. The semiconductor device according to claim 2, wherein the second prohibition information control circuit is configured to read prohibition information from the second CAM and to prohibit writing to a WPCAM unless a WPCAM write signal is received as input and the second prohibition information corresponds to an erase state.

8. The semiconductor device according to claim 7, wherein the second prohibition information control circuit comprises a second switch, wherein writing in a WPCAM is allowed only when the second switch is turned on.

9. The semiconductor device according to claim 8, wherein the second switch is turned off when the prohibition information in the second CAM corresponds to a write state, and turned on when the prohibition information in the second CAM corresponds to an erase state.

10. The semiconductor device according to claim 9, wherein the second switch is turned off when the prohibition information in the second CAM corresponds to a write state, and turned on when the prohibition information in the second CAM corresponds to an erase state, regardless of the prohibition information in the first CAM.

11. The semiconductor device according to claim 1, wherein the plurality of WPCAMs are disposed on a plurality of p-type wells.

12. The semiconductor device according to claim 1, wherein the plurality of CAMs are disposed on a plurality of p-type wells.

13. The semiconductor device according to claim 1, wherein the plurality of CAMs are disposed on a different plurality of wells from the wells upon which the WPCAMs are disposed.

14. The semiconductor device according to claim 1, wherein the first CAM is disposed on a different well from the well upon which the second CAM is disposed.

15. The semiconductor device according to claim 1, wherein the semiconductor device comprises a flash memory device.

* * * * *